United States Patent [19]
Takahashi et al.

[11] Patent Number: 5,617,945
[45] Date of Patent: Apr. 8, 1997

[54] DEVICE TRANSFER MECHANISM FOR IC TEST HANDLER

[75] Inventors: Hiroyuki Takahashi, Kazo; Kenpei Suzuki, Gyoda, both of Japan

[73] Assignee: Advantest Corporation, Tokyo, Japan

[21] Appl. No.: 438,947

[22] Filed: May 11, 1995

[30] Foreign Application Priority Data

May 27, 1994 [JP] Japan .................................. 6-138085

[51] Int. Cl.$^6$ ................................................ B65G 17/46
[52] U.S. Cl. ........................................................ 198/471.1
[58] Field of Search ............................. 198/469.1, 470.1, 198/471.1, 478.1, 468.4, 950, 952

[56] References Cited

U.S. PATENT DOCUMENTS

| | | | |
|---|---|---|---|
| 3,563,170 | 2/1971 | Cvacho et al. | 198/471.1 X |
| 3,712,450 | 1/1973 | Hurst | 198/471.1 |
| 3,715,056 | 2/1973 | Preston | 198/471.1 X |
| 4,752,206 | 6/1988 | Nowicki et al. | 198/471.1 X |
| 5,469,953 | 11/1995 | Igarashi et al. | 198/471.1 X |
| 5,494,149 | 2/1996 | Sillner | 198/471.1 |

FOREIGN PATENT DOCUMENTS 0401698  12/1990  European Pat. Off. ............ 198/471.1

*Primary Examiner*—James R. Bidwell
*Attorney, Agent, or Firm*—Knobbe, Martens, Olson & Bear, LLP

[57] ABSTRACT

A device transfer mechanism of an IC test handler is disclosed which is low cost, requires less space and has an inexpensive and simple structure. The device transfer mechanism can readily change a soak time for applying predetermined temperature to the devices to be tested according to the device test time. A device transfer mechanism includes a circular-orbit rotation table with multiple pockets that stores the devices by a unit of n pieces on the disk-shaped rotation table, and at least three arms each of which has a contact arm with a suction section that sucks the devices by a unit of n pieces at the tip of each arm. A rotation storage arm can be additionally provided to transfer the devices by arranging multiple arms with pockets that store devices 71 by a unit of n pieces at the tip of each arm. In a further aspect of the transfer mechanism, pockets that store the devices by a unit of n pieces at the tip of each arm can be disposed along with a reciprocal storage arm that transfers the devices in a reciprocal movement to a storage buffer section.

14 Claims, 6 Drawing Sheets

DEVICE TRANSFER MECHANISM FOR IC TEST HANDLER

FIELD OF THE INVENTION

This invention relates to an IC test handler system mechanism, that transfers IC devices from a supply tray to a contact section for electrical testing, then transfers the IC devices from the contact section to a storage tray.

BACKGROUND OF THE INVENTION

A prior art for the device-transfer mechanism for an IC test handler system is described by referring to FIGS. 6, 7, and 8. This system is comprised of a supply buffer section 40, a thermal insulation wall 54, a soak chamber 110, a rotational arm 120, a measurement section 70, a storage buffer section 50, and a transfer mechanism of multiple boats 100. As a transfer-drive method, drive sources such as a pulse motor and a servo motor, and a combination of belts, gears and a rotation-screw mechanism are used for this purpose.

A suction section for IC devices 71 is arranged at the tip of a rotation arm 120 as shown in FIG. 8, and is comprised of a suction pad 82, which sucks the IC device 71, a suction arm 80 and an up/down drive mechanism 84. An air regulating pressure 83, of vacuum pressure/atmospheric pressure from an ejector for an external suction control is connected to the suction arm 80 and is supplied to the suction pad 82. The device 71 is sucked and released by air pressure in the suction pad 82. The up/down drive mechanism 84 using a cylinder or a solenoid and driven by a control signal 85, transfers the device 71 in the up and down strokes.

Inside the thermal shield wall 54 is a constant-temperature chamber having a structure of thermal insulation for heating and cooling the device to set to a desired temperature until the device is measured at the measurement section 70. In order to maintain the device to be measured at the constant temperature, it is required that the device be kept inside the constant temperature chamber for more than a preset period. Hence, the soak chamber is designed to provide this preset period. Inside the thermal insulation wall 54, a structure is arranged so that boats 100 can pass through for supplying and storing devices.

Here, the time duration between the time when the device is placed in the constant-temperature chamber and the time when the device reaches a constant temperature is called a "soak time." Also, the time between the completion of device electrical testing and the start of the next device testing is called an "index time." The time between the start and end of the device electrical testing is called a "test time." Also, the total of the index time and test time is called a "cycle time." Also, the duration of the device test time from the time the device is taken out from the supply tray and the time the device is placed in the storage tray is called an "output time."

Transfer of the device 71 is performed by a mechanism including the boats. A pocket 13 that carries one or several devices is disposed on the boat 100, moved and transferred by a unit of the boat. The boat carrier mechanism is disposed to move the boats 100 by rotation, and each path for the boats 100 has a transfer mechanism. The path starts at a supply buffer section 40, and its route runs through paths 201, 205, 206, 207, 208 and is returned.

A plurality of boats 100 whose pockets are shaped according to the device configurations (DIP, SOP, QFP, etc.) to be carried, can be readily replaced with other boats even when the device configuration is changed. The supply buffer section 40 is comprised of a supply y-arm 41, a supply x-arm 42, and a supply tray 43. A suction section 45 is set at the tip of the supply y-arm 41. The transfer operation is, first to move the supply y-arm 41 and the supply x-arm 42 to pick up a device by a suction force from above the supply tray 43, then to carry the device to the pocket position of the boat 100 at the position 200 and to release and drop the device. The operation is repeated for every supply timing.

The device 71 on the boat 100 at the position 200 is carried to a soak chamber 110 through the path 201 by a horizontal transfer mechanism after passing through the thermal shield wall 54. The soak chamber 110 is a buffer used to provide time, i.e., the soak time, for heating and cooling the devices 71 to a preset temperature in the constant-temperature chamber. This soak chamber has many boats 100 inside the chamber in order not to reduce the index time of the IC handler. The boat 100 carried to the soak chamber 110 moves up through the path 202 one by one as shown in FIG. 7, moves to the adjacent path 203, moves down the path 204, and reaches the suction section 121a of the supply arm position of a rotation arm 120 on the path 205.

There are four arms on the rotation arm 120. Suction sections 121a, 121b, 121c, and 121d are disposed at the tips of each arm. The first arm at the supply position of the rotation arm 120 drives the suction section 121a down and by a suction force picks up the device 71 positioned at the pocket on the boat 100, then moves up. A device 71 at the second arm of the rotation arm 120 is simply a standby device.

The third arm at the measurement position of the rotation arm 120 moves down a device 71 at the suction section 121c, places the device 71 on the contacts of the measurement section 70, where the electrical testing is proceeded. The third arm brings up the device by suction after completing the electrical testing, then moves upward. Here, in the measurement section 70, leads of the device 71 received from the rotation arm 120 makes contact with electrodes for electrical testing and measurements for various electrical tests are performed.

The fourth arm of the rotation arm 120 at the storage position lowers the device 71 at the suction section 121d and drops it in the pocket of the boat 100. This boat 100 is empty after having passed through the paths 205 and 206. The above noted four arms are rotational-type transfer mechanisms that perform suction of the devices to be measured or the measured devices, device measurements, and ejection of the device after measurements all at once, rotating for every cycle and moving to the next process.

The boat 100 at the suction section 121d where a device 71 is riding after measurements reaches the position 210 of the storage y-arm 51 by transfer on the path 207. The storage buffer section 50 comprises a storage y-arm 51, a storage x-arm 52, and a storage tray 53. A suction section 55 is arranged at the tip of the storage y-arm 51. The transfer operation is used to transfer the storage y-arm 51 and storage x-arm 52 after lifting the device by suction at the position 210 using the suction section 55, and to drop the device 100 in the pocket of the storage tray 53 after carrying the device 100 to a predetermined position of the storage tray 53. This storage operation is repeated.

As described above, in the prior art device transfer mechanism, the structure of the soak chamber 110 is complex because of too many transfer processes. Further, because of so many transfer-drive devices, the cost of the mechanism is very high. Moreover, the soak chamber 110 requires a large installation space and a large constant-temperature chamber, which is not desirable.

In addition, in the prior art, the transfer processes of boats 100 increase because the devices are moved by riding on the boat 100, which results in unnecessary mechanisms, and it is not necessarily an adequate structure for the handler, which is required to be durable and reliable. Also, one of the four arms of the rotation arm 120 is not used, which increases the cost for its suction section.

In addition, a mechanism for changing the number of boats 100 to be stored in the soak chamber 110 is not readily changed. Therefore, it is designed to store many boats in order to secure the soak time even when the test time for the device is short. However, because of this arrangement, the optimum number of boats corresponding to different test times for various devices cannot be changed flexibly, and it may provide soak time more than required, and is not necessarily easy to operate.

SUMMARY OF THE INVENTION

Therefore, it is an object of the present invention to provide a device transfer mechanism having a simplified structure and operation to improve reliability such as a mean time between failure (MTBF).

It is another object of the present invention to provide a device transfer mechanism which can improve a cost-performance by reducing the cost without decreasing the efficiency.

It is a further object of the present invention to provide a device transfer mechanism which has a smaller installation space and is capable of allowing the soak time to be readily changed according to the test time of the devices of interest.

FIGS. 1, 2, and 3 illustrate a means of resolving the above issues through this invention. In resolving the above issues, with the structure of the invention, multiple depression like pockets 13 are arranged to store devices 71 by unit of n pieces on a disc-shaped rotation table 12 in order to receive devices 71 from the supply buffer section 40, and the rotation table 12 with a circular orbit is arranged to transfer devices 71 to a contact arm 14.

In order to receive the device 71 from the rotation table 12, the contact arm in a circular orbit with, at least, three arms are arranged. The contact arm 14 has a suction section 15 at the tip of each arm that holds devices 71 in place by an unit of n pieces, at the same time, transfers other devices 71 to a rotation storage arm 16 or a reciprocating storage arm 216.

The rotation storage arm 16 has multiple arms to receive devices 71 from the contact arm 14, and multiple depression like pockets 13 are arranged at the tip of each arm to store the devices 71 with an unit of n pieces, at the same time, to transfer other devices 71 to a storage buffer section 50.

Also, the reciprocating storage arm 216 has arms and at the tip of the arms, the depression like pocket 13 is arranged to store devices 71 with an unit of n pieces from the contact arm 14. Next, the devices 71 are transferred to the buffer section 50 by moving this arm. After transferring the devices, the arm is returned to a position where it can again receive devices 71 from the contact arm 14. In this way the reciprocating storage arm 216 performs reciprocal motion.

The rotation table 12, the contact arm 14 in both circular orbits, and the device-transfer mechanism of the IC test handler by the transfer mechanism of device 71 in coordinating with the storage arm (16 or 216), possess a buffer function of providing the soak time for heating and cooling the devices, and together form a mechanism that transfers the devices to the measurement section 70 and the storage buffer section 50.

As a means of control of the rotation table 12 in the transfer mechanism there exists a rotation-control method that rotates in a normal or reverse direction at increments of angles equal to one of the pocket 13 or m pieces of the pocket 13. By the above way, a means that can flexibly adopt different soak times for heating and cooling the device to be measured can be realized by skipping the pockets or reversing the rotation for placing the devices.

The rotation table 2 possesses a buffer function for gaining the soak time of heating and cooling the devices by arranging a number of pockets in a circular shape, and a function that transfers the devices to the contact arm 14. In addition, a function that can cope with the different soak times can be realized by controlling the rotation-drive mechanism and skipping the pockets or by reversing the rotation.

When the contact arm 4 has three arms, transferring the devices to the device receiving position, the measurement position, and the ejection position are realized by a rotation mechanism that allows for rotation of the three arms in 120 degrees. When the storage arm 16 has three arms, transferring the devices to the device receiving position and the storage position are realized by a rotation mechanism that allows for rotation of 120 degrees.

DETAILED DESCRIPTION OF THE INVENTION

Figure 1:
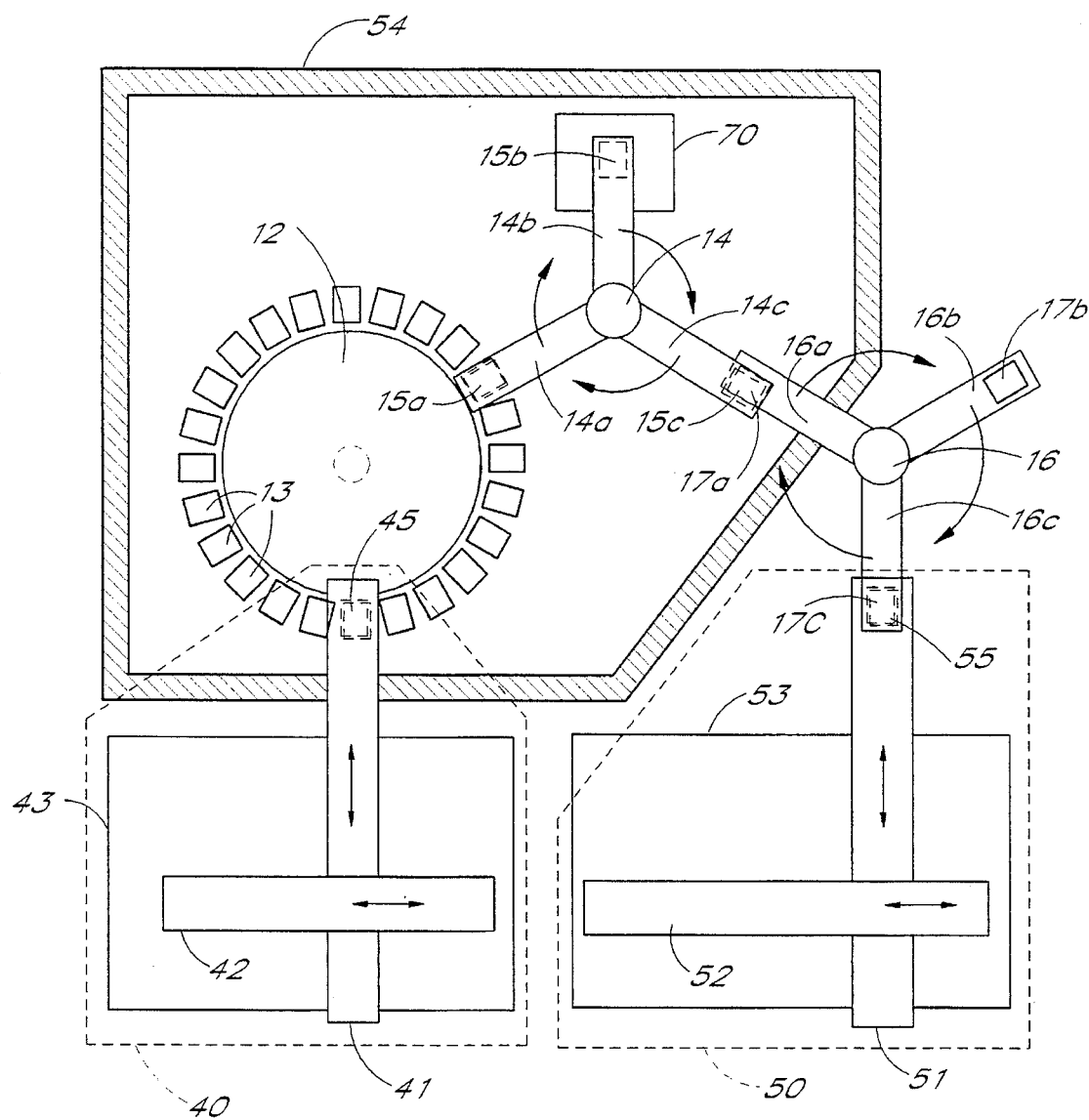
FIG. 1 is a block diagram of the first embodiment of IC transfer mechanism having three rotation arms with an circular orbit by this invention.

The first embodiment of the present invention is described with reference to the drawings. This example is a device transfer IC test handler mechanism employing the rotation table 12 for heating/cooling, rotation contact arm 14 for measurements, and rotation storage arm 16 for storage, which all have a means of operating in a circular orbit. FIG. 1 shows such a device transfer mechanism.

The composition of this system is a supply buffer section 40, a thermal shield wall 54, a rotation stable 12, a contact arm 14, a measurement section 70, a rotation storage arm 16, and a storage buffer section 50. In this composition, the supply buffer section 40, the storage buffer section 50, and the thermal shield wall 50 are identical to that used in the conventional system.

The supply buffer section 40 is composed of a supply y-arm 41, a supply x-arm 42, and a supply tray 43. A suction section 45 is set at the tip of the supply y-arm 41. The supply side of the device is to place a number of devices laying on the supply tray 43 on a pocket 13 of a rotation table 12 orderly. After moving the suction section 45 to a preset position over the supply tray 43 by the supply y-arm 41 and supply x-arm 42, the device 71 to be tested is lifted by a suction force and carried above the pocket 13 of the rotation table 12, released and dropped.

The rotation table 12 is a mechanism equivalent to the soak chamber of the prior art, and it is a buffer section to provide a soak time for heating and cooling the devices 71 to be tested to a predetermined temperature in the constant temperature chamber. For this reason, a number of depression-like pockets 13 are formed on the rotation table 12. The device 71 placed on the pocket 13 of the rotation table 12 is moved by rotation at an increment of one pocket unit by the supply y-arm 41. The device 71 is heated or cooled to the predetermined temperature during rotational movement before reaching under the contact arm 14. Thereafter, the device 71 is transferred to the next process by the contact arm 14.

The rotation operational timing of the rotation table 12 is such that after the device is placed on the receiving side and lifted by suction from the supply-side pocket and raised, it is moved by rotation to the next pocket position. That is, it moves asynchronously with the rotational movement of the contact arm 14. As a result, this rotation table 12 not only provides the means for one rotational drive, but is also a simple structure. When the device configuration is changed, it is designed to replace the rotation table 12.

On the tip of the contact arm 14, the suction sections 15a, 15b, and 15c are arranged. The first arm 14a at the supply position of the contact arm 14 lifts by suction a device onto the pocket of the rotation table 12 by lowering the suction section 15a, raises, and holds the device.

The second arm 14b at the measurement position of the contact arm 14 lowers a device on the suction section 15b and places on the contact of the measurement section 70, then electrical testing starts and the device is lifted by suction upon completion of the electrical testing, raised and held.

The third arm 14c at the storage position of the contact arm 14 lowers a device on the suction section 15c, releases and drops it on the pocket of the rotation storage arm 16. By this action, the device is supplied and removed by simply rotating the contact arm 214 by 120 degrees. Also, because there are no unused arms, it simplifies the structure of the transfer mechanism.

On the tip of the rotation storage arm 16, depression like pockets 17a, 17b, and 17c are arranged for storing devices. The first arm 16a at the device receiving position of the rotation storage arm 16 receives a device with the pocket 17a from the contact arm 14.

The second arm 16b at the midpoint of the rotation storage arm 16, though no activities have taken place, only provides waiting time for the device being returned to a normal temperature, especially after high- and cold-temperature tests. This is because when the device is brought outside where a sudden large temperature difference exists, which could degrade IC packages on rare occasions. Or, it has the role of bringing it back to a normal temperature when the storage tray 53 does not have durability.

The third arm 16c at the device storage arm position of the rotation storage arm 16 transfers a device on the pocket 17c by sucking it with the storage y arm 51. By this action, the device is transferred to the storage y arm position by a 120 degree rotation of take rotation storage arm 16, and the empty arm is returned to the contact arm 14. Hence, there is no wasted arm movement, so the transfer time is short and its structure is simple.

For the above explanation, there is a means of shortening the output time by reversing the rotation storage arm 16. In this case it can be applied to a situation in which it does not require a temperature-normalization time because there is a small temperature difference between the constant-temperature chamber and outside ambient temperatures or it does not require heating applications.

The storage buffer section 50 is composed of the storage y-arm 51, storage x-arm 52, and storage tray 53. The suction section 55 is arranged at the tip of the storage y arm 51. The storage side of a device sucks a device after moving the suction section 55 by the storage y-arm 51 and storage x-arm 52 over the rotation storage arm 16, then moves to the storage tray 53, releases and drops the device.

Figure 2:
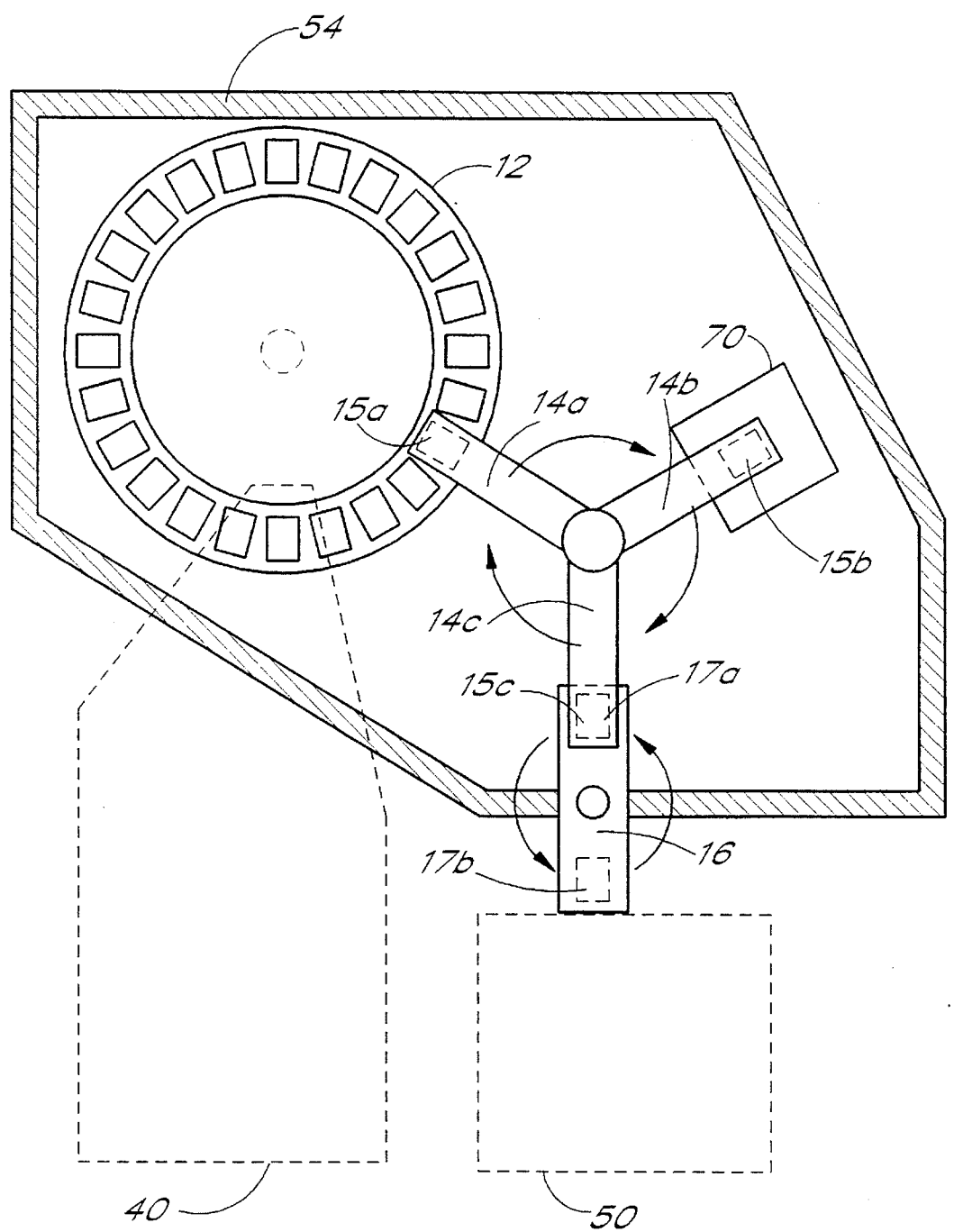
FIG. 2 is a block diagram of the second embodiment of IC transfer mechanism having three rotation arms with an circular orbit by this invention.
Figure 3:
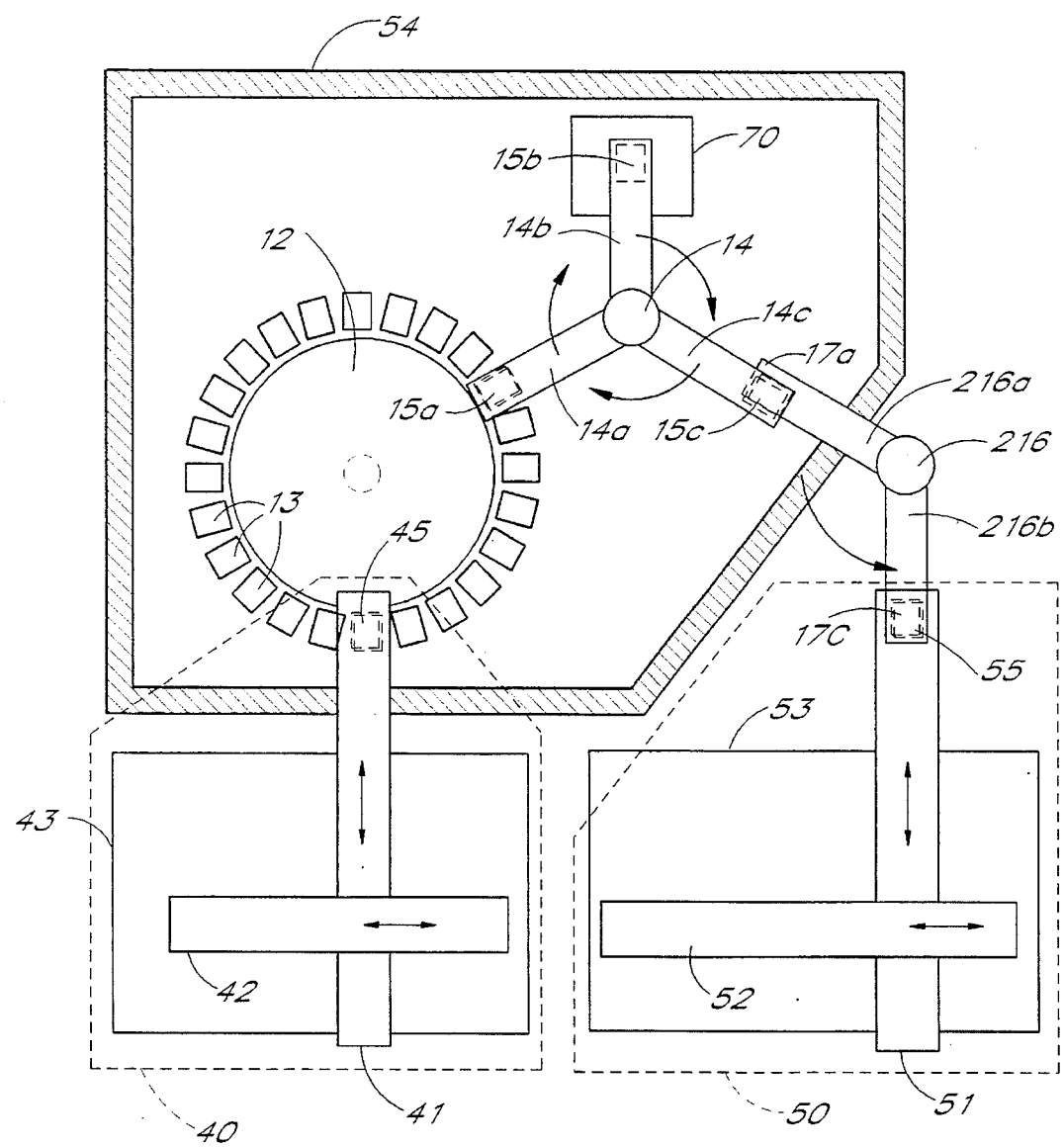
FIG. 3 shows a structure of third embodiment of IC transfer mechanism having two rotation arms with an circular orbit and one reciprocating storage arm.

In this example, the contact arm 14 comprises three arms. However, the number of arms can be four as an example of the prior art. Also, it can be n arms as required. Generally, the more the arms, the more expensive and heavier it becomes. The second embodiment of this invention is explained by referring to the drawings. An example of this invention is a device-transfer mechanism for an IC test handler using three circular-orbit devices when the rotation storage arm 16 has two arms. This is described by referring to FIG. 2.

This system is comprised of the supply buffer section 40, thermal shield wall 54, rotation table 12, contact arm 14, measurement section 70, rotation storage arm 16, and storage buffer section 50. In this composition, three arms of the rotation storage arm 16 in the first embodiment is reduced to two arms, which is the only difference. In this rotation storage arm 16, its structure is simpler, and its output time can be reduced.

The third embodiment of the present invention is explained with reference to the drawings. In the example of the subject invention, a device-transfer mechanism for an IC test handler is structured so that the devices 71 can be transferred by a reciprocating movement mechanism employing the reciprocating storage arm 216 in place of the storage arm. This is explained by referring to the figures.

This system is comprised of the supply buffer section 40, thermal shield wall 54, rotation table 12, contact arm 14, measurement section 70, reciprocating storage arm 216, and storage buffer section 50. In this composition, the rotation storage arm 16 in the first embodiment is replaced with the reciprocating storage arm 216, and which is the only difference.

In the reciprocating storage arm 216, depression like pockets 13, which store devices 71 from the contact arm 14 by unit of n pieces at the tip of an arm are arranged. The devices are transferred to the storage buffer section 50 by moving the arm. After completing the device transfer this arm is returned to a position where the arm receives devices again from the contact arm 14. By this way, the reciprocating storage arm 2 performs a reciprocating movement. Likewise, in this reciprocating storage arm 216, its structure is simpler and its output time can be reduced.

Figure 4:
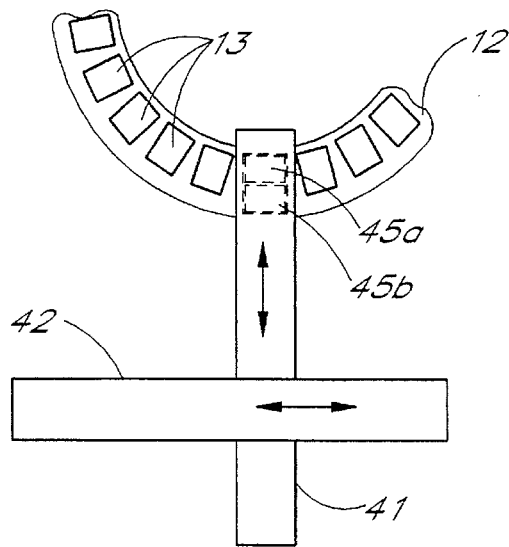
FIG. 4 is a structural view with two suction sections 45a and 45b on the supply y-arm in this invention.

Other embodiments of this invention are explained by referring to the drawings. In the above embodiments, the suction section 45 for the device supply of the supply y-arm 41 was described as one case example, but as shown in FIG. 4, there is a structure with two suction sections 45a and 45b for a structure of supply y-arm 41. By this arrangement, two devices 71 are lifted at the same time by the suction of two suction sections 54a and 54b from the supply tray, then moved to the rotation table 12.

Thereafter, as the first control method, when they are placed at the rotation table 12 after movement in the y-direction, after waiting until the rotation table 12 side moves, the y-moving distance of the supply y-arm 41 is controlled in two stages so that the devices are placed one at a time. In this way, a reciprocating movement time of the supply y-arm 41 and supply x-arm 42 can be reduced, and devices can be supplied to the rotation table 12 at a high speed.

As the second control method, devices 71 are placed at the first and second pockets one at a time, with no waiting time. That is, devices 71 are rotated to two pocket positions by controlling the rotational transfer of the rotation table 12, then transfer of y-direction movement distance of the supply y-arm 41 is controlled in two stages. Thereafter, the rotation table 12 should be returned to the original position. In this case, devices 71 are supplied to the rotation table 12 at a faster speed than the first control method.

As a result, a reciprocating movement of the supply y-arm 41 is reduced by one-half. In this case, this method can cope with a high speed cycle time as the device supply time becomes approximately one-half. From the foregoing, similarly, the suction sections of the supply y arm 41 can be changed from two to n sections, and it can likewise be implemented. Also, with regard to the storage y-arm 51 side, by opposite operation of the supply y-arm 41, n number of suction sections can be arranged and implemented.

Figure 5:
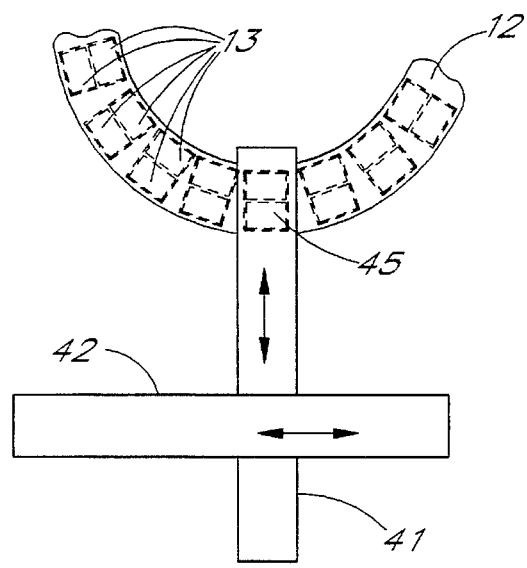
FIG. 5 is a structural view with two suction sections 45a and 45b on the supply y-arm and corresponding pockets on the rotation-table side.
Figure 6:
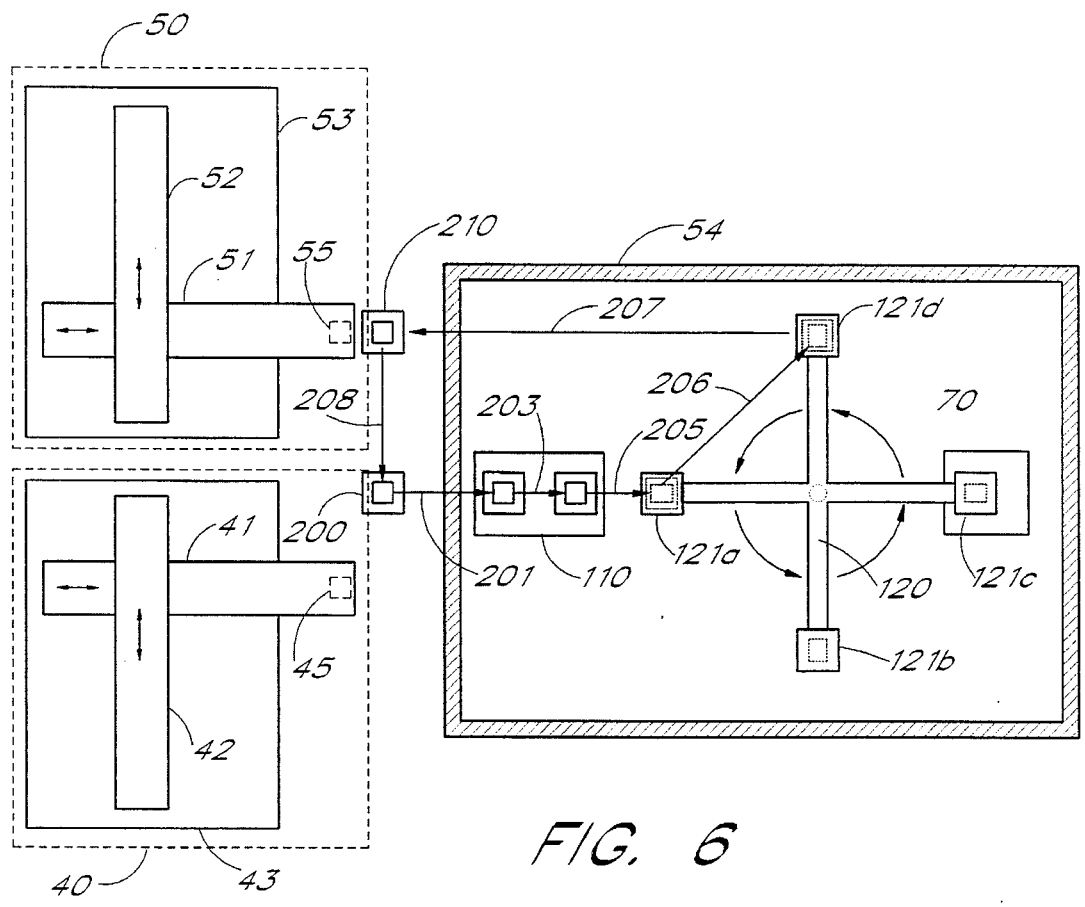
FIG. 6 is a block diagram showing a conventional IC transfer mechanism.
Figure 7:
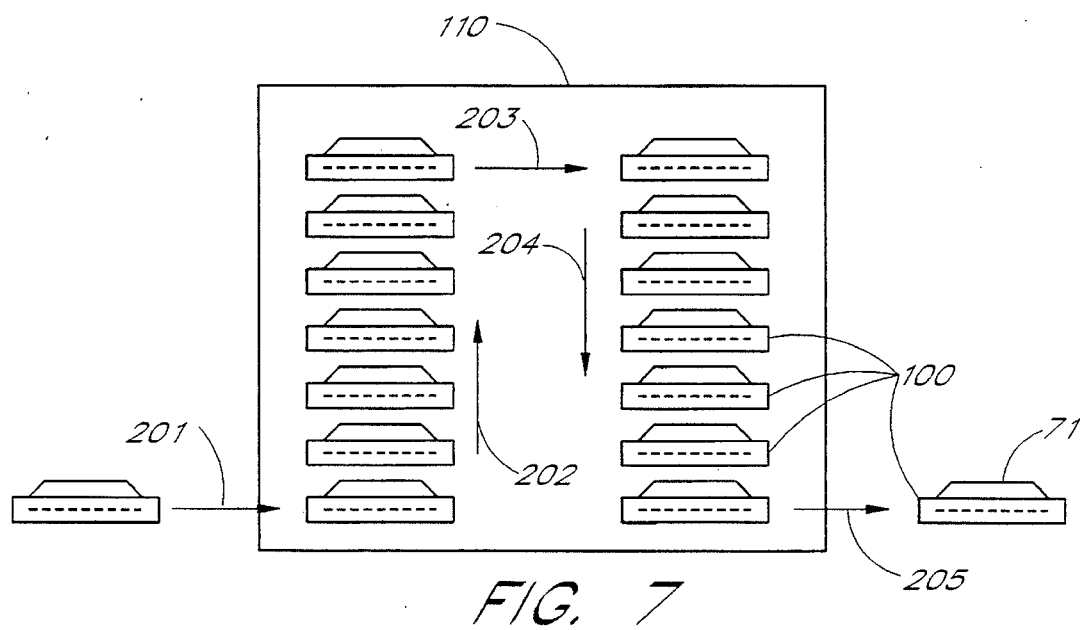
FIG. 7 depicts a transfer operation of the soak chamber 110 in the conventional IC transfer mechanism of FIG. 6.
Figure 8:
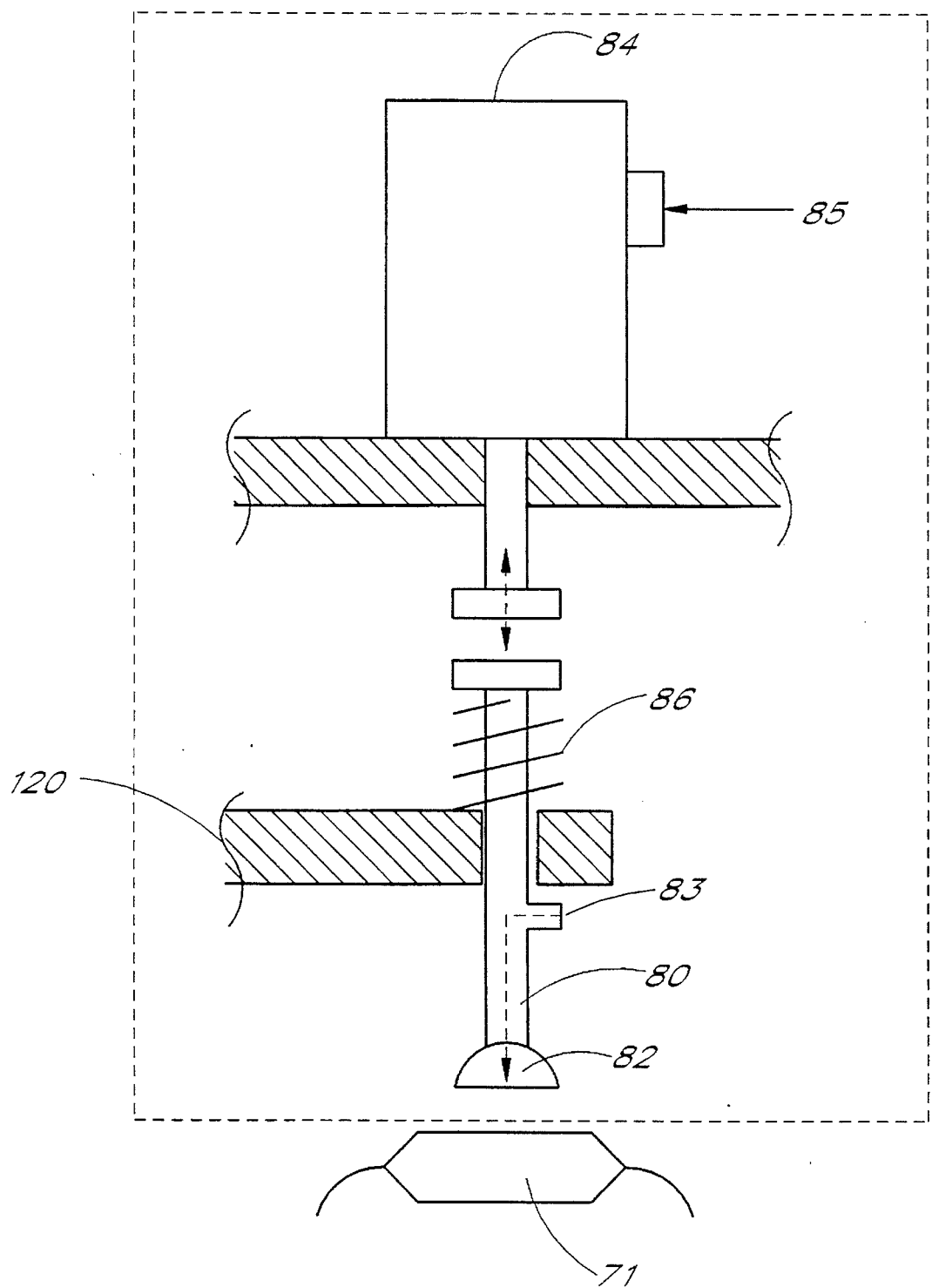
FIG. 8 illustrates a structure of the suction section.

In the above description of the first, second and third embodiments, an example of sucking one device to be tested with the suction section 45 is mentioned as shown in FIG. 5. However, several devices, for example, two and four etc., can be sucked and released at once and the corresponding pocket 13 can be structured accordingly, and similarly can be implemented. In addition, with regard to the storage y-arm 51, the suction section is arranged by n units, and similarly implemented can cope with an even higher cycle speed.

In the above description of the embodiment 1, 2, and 3, devices are placed on all pockets by rotating one pocket of the rotation table 12 at a time. However, there is a way of shortening the output time by optimizing wasted waiting time on the rotation table 12 when the test time at the measurement section 70 is long and there is a margin for soak time. That is, the rotation table 12 is controlled by skipping pockets 13 so that soak time is satisfied. In the reverse direction, waiting time on the rotation table 12 can be optimized by taking advantage of fewer pockets up to the contact arm 14 and controlling the rotation table 12 to the reverse direction. By these methods, the rotation table 12 can be utilized at an optimal condition in response to cycle time and soak time.

This invention, as structured as described above, has the following effects:

The rotation table has an effect of providing a buffer function with which to gain soak time for heating and cooling by arranging a number of pockets in a circular shape with a means of circular-orbit rotation by a pocket unit. Also, soak time can be readily controlled according to the device test time by controlling this rotation and placing the device by skipping the pockets, hence it is convenient for the user.

Furthermore, only one rotation-drive mechanism as a drive means is installed, and it can realize a simple mechanism, an improve MTBF, and has a benefit of being able to build with less space and lower costs. It also has the advantage of making the constant-temperature chamber smaller by requiring a less space.

At the contact arm 14, transfer for device supply and ejection can be done by a circular- orbit method that rotates 120 degrees. The drive method for this is to arrange only one rotation-drive device. Further, it has the advantage of being a simple mechanism.

At the rotation storage arm 16, devices are received from the contact arm 14 by a rotating circular-orbit device and rotated to the suction position of the storage y arm 51. The drive method for this is to arrange only one rotational driving device, further it has the advantage of bring a simple mechanism.

It has an effect of realizing device transfer with minimum output time by linking and arranging the said three rotating circular-orbit methods and controlling preset rotation. Also, it has the effect of transferring devices in the optimal index time.

What is claimed is:

1. A device transfer mechanism for an IC test handler, comprising:

a disc-shaped rotation table (12) having a plurality of pockets (13) for storing IC devices (71) to be tested received from a supply area and transferring said IC devices to an area close to a test section (70) on said IC test handler, said rotation table (12) having a soak chamber for providing predetermined temperature to said IC devices during the period of said transferring said devices (71);

a contact arm (14) having a plurality of pickup arms (14a, 14b, 14c) symmetrically arranged with respect to a vertical axis, said contact arm rotating to pickup said IC devices from said rotation table (12) and transfer said IC devices (71) to said test section (70) on said IC handler, each of said pickup arms (14a 14b, 14c) of said contact arm (14) having a suction section (15) at the outer end; and storage arm (16) having a plurality of pickup arms (16a, 16b) to receive said IC devices that have been tested from said contact arm (14), each of said pickup arms (16a–16c) of said storage arm (16) having a suction section (15) at the outer end for picking up and transferring said IC devices to a storage area.

2. A device transfer mechanism for an IC test handler as defined in claim 1, further comprising:

a supply section (40) provided in said supply area for supplying said IC devices (71) to be tested to said rotation table (12); and a storage section (50) provided in said storage area for receiving said IC devices (71) that have been tested from said storage arm (16).

3. A device transfer mechanism for an IC test handler as defined in claim 1, wherein said supply section (40) has a supply arm mechanism (41, 42) which is moveable in X and Y directions on the surface of said supply section, and said storage section (50) has a storage arm mechanism (51, 52) which is moveable in X and Y directions on the surface of said storage section.

4. A device transfer mechanism for an IC test handler as defined in claim 1, wherein said rotation table (12) rotates by a step corresponding to either every one pocket (13) or every two or more pockets (13) depending on a time required for testing said IC device (13) in said test section (70).

5. A device transfer mechanism for an IC test handler as defined in claim 1, wherein said rotation table (12) rotates in a clockwise direction or a counter clockwise direction based on a time required for reaching said predetermined temperature in said IC devices (71) to be tested.

6. A device transfer mechanism for an IC test handler as defined in claim 1, wherein said contact arm has three pickup arms (14a, 14b, 14c) each of which is 120 degrees apart from the other with respect to said vertical axis.

7. A device transfer mechanism for an IC test handler as defined in claim 1, wherein said storage arm has three pickup arms (16a, 16b, 16c) each of which is 120 degrees apart from the other with respect to a vertical axis.

8. A device transfer mechanism for an IC test handler as defined in claim 7, wherein said three pickup arms (16a, 16b, 16c) rotate in a direction which attains a time for returning said IC devices (71) that have been tested to room temperature before reaching said storage arm (16).

9. A device transfer mechanism for an IC test handler as defined in claim 1, wherein said storage arm has two pickup arms (16a, 16b) one of which is 180 degrees apart from the other with respect to a vertical axis.

10. A device transfer mechanism for an IC test handler as defined in claim 1, wherein said storage arm has two pickup arms (16a, 16b) one of which is 120 degrees apart from the other with respect to a vertical axis, said storage arm alternately changing directions of rotation for picking up said IC devices (71) that have been tested at said contact arm and transferring said IC devices to a storage section (59).

11. A device transfer mechanism for an IC test handler as defined in claim 2, wherein said rotation table (12) has two or more pockets in the same radius direction and said supply section (40) has two or more suction sections for carrying a plurality of IC devices (71) at the same time to said rotation table.

12. A device transfer mechanism for an IC test handler as defined in claim 2, wherein said supply section (40) and said storage section are positioned in the same side of said rotation table (12).

13. A device transfer mechanism for an IC test handler as defined in claim 11, said contact arm (14) has a plurality of suction sections at each of said pickup arms (14a–14c) to receive a plurality of said IC devices from said rotation table (12) at the same time.

14. A device transfer mechanism for an IC test handler as defined in claim 11, said supply section (40) has a supply arm mechanism (41, 42) which is moveable in X and Y directions on the surface of said supply section, said supply arm mechanism stops in said Y direction on each of said two or more pockets to place said IC devices (71) on said pockets (13).

* * * * *